(12) United States Patent
Armstrong

(10) Patent No.: US 8,760,824 B2
(45) Date of Patent: Jun. 24, 2014

(54) GROUND FAULT CIRCUIT INTERRUPTER (GFCI) MONITOR

(75) Inventor: Bruce Armstrong, San Mateo, CA (US)

(73) Assignee: Fairchild Semiconductor Corporation, San Jose, CA (US)

( * ) Notice: Subject to any disclaimer, the term of this patent is extended or adjusted under 35 U.S.C. 154(b) by 202 days.

(21) Appl. No.: 13/411,550

(22) Filed: Mar. 3, 2012

(65) Prior Publication Data

US 2012/0257314 A1    Oct. 11, 2012

Related U.S. Application Data

(60) Provisional application No. 61/449,489, filed on Mar. 4, 2011.

(51) Int. Cl.
*H02H 3/00* (2006.01)

(52) U.S. Cl.
USPC .......................................................... 361/42

(58) Field of Classification Search
USPC .......................................................... 361/42
See application file for complete search history.

(56) References Cited

U.S. PATENT DOCUMENTS

| | | | |
|---|---|---|---|
| 5,459,630 A | 10/1995 | MacKenzie et al. |
| 5,477,412 A | 12/1995 | Neiger et al. |
| 5,600,524 A | 2/1997 | Neiger et al. |
| 5,715,125 A | 2/1998 | Neiger et al. |
| 5,729,417 A | 3/1998 | Neiger et al. |
| 5,963,408 A | 10/1999 | Neiger et al. |
| 6,111,733 A | 8/2000 | Neiger et al. |
| 6,226,161 B1 | 5/2001 | Neiger et al. |
| 6,262,871 B1 | 7/2001 | Nemir et al. |
| 6,266,219 B1 | 7/2001 | Macbeth et al. |
| 6,370,001 B1 | 4/2002 | Macbeth |
| 6,377,427 B1 | 4/2002 | Haun et al. |
| 6,421,214 B1 | 7/2002 | Packard et al. |
| 6,433,977 B1 | 8/2002 | Macbeth |
| 6,532,424 B1 | 3/2003 | Haun et al. |
| 6,538,863 B1 | 3/2003 | Macbeth |
| 6,567,250 B1 | 5/2003 | Haun et al. |

(Continued)

FOREIGN PATENT DOCUMENTS

| CN | 2896630 Y | 5/2007 |
|---|---|---|
| CN | 101910856 A | 12/2010 |

(Continued)

OTHER PUBLICATIONS

"Chinese Application Serial No. 201210073705.7, Office Action mailed Dec. 30, 2013", 12 pgs.

(Continued)

*Primary Examiner* — Jared Fureman
*Assistant Examiner* — Kevin J Comber
(74) *Attorney, Agent, or Firm* — Schwegman, Lundberg & Woessner, P.A.

(57) ABSTRACT

This document discusses, among other things, a self-test (ST) ground fault circuit interrupter (GFCI) monitor configured to generate a simulated ground fault starting in a first half-cycle of a first cycle of AC power and extending into a second half-cycle of the first cycle of AC power, wherein the first half-cycle of the first cycle of AC power precedes the second half-cycle of the first cycle of AC power. Further, the ST GFCI monitor can detect a response to the simulated ground fault.

35 Claims, 13 Drawing Sheets

(56) References Cited

U.S. PATENT DOCUMENTS

| | | |
|---|---|---|
| 6,611,406 B2 | 8/2003 | Neiger et al. |
| 6,621,669 B1 | 9/2003 | Haun et al. |
| 6,674,289 B2 | 1/2004 | Macbeth et al. |
| 6,807,035 B1 | 10/2004 | Baldwin et al. |
| 6,807,036 B2 | 10/2004 | Baldwin |
| 6,873,158 B2 | 3/2005 | Macbeth |
| 6,980,005 B2 * | 12/2005 | Finlay et al. ............... 324/424 |
| 7,068,481 B2 | 6/2006 | Radosavljevic et al. |
| 7,099,129 B2 | 8/2006 | Neiger et al. |
| 7,149,065 B2 | 12/2006 | Baldwin et al. |
| 7,151,656 B2 | 12/2006 | Dvorak et al. |
| 7,253,629 B1 | 8/2007 | Richards et al. |
| 7,265,956 B2 | 9/2007 | Huang |
| 7,289,306 B2 | 10/2007 | Huang |
| 7,295,415 B2 | 11/2007 | Huang et al. |
| 7,315,437 B2 | 1/2008 | Bonilla et al. |
| 7,428,132 B1 | 9/2008 | Radosavljevic et al. |
| 7,439,832 B1 | 10/2008 | Radosavljevic et al. |
| 7,443,309 B2 | 10/2008 | Baldwin et al. |
| 7,486,492 B2 | 2/2009 | Elms |
| 7,573,692 B1 | 8/2009 | Weeks et al. |
| 7,576,960 B2 | 8/2009 | Gao et al. |
| 7,586,718 B1 | 9/2009 | Radosavljevic et al. |
| 7,692,904 B2 | 4/2010 | Li et al. |
| 7,719,804 B1 | 5/2010 | Morgan et al. |
| 7,733,617 B2 | 6/2010 | Baldwin |
| 7,751,160 B1 | 7/2010 | Radosavljevic et al. |
| 7,791,848 B2 | 9/2010 | Baldwin et al. |
| 7,800,873 B2 | 9/2010 | Batko et al. |
| 7,800,874 B2 | 9/2010 | DiSalvo et al. |
| 8,085,516 B1 * | 12/2011 | Armstrong .................. 361/42 |

FOREIGN PATENT DOCUMENTS

| | | | |
|---|---|---|---|
| CN | 102694364 A | 9/2012 | |
| CN | 202696112 U | 1/2013 | |
| WO | WO 2009097469 A1 * | 8/2009 | ............. G01R 31/00 |

OTHER PUBLICATIONS

"Chinese Application Serial No. 201220105396.2, Notification to Make Rectification mailed Jul. 17, 2012", 2 pg.

"Chinese Application Serial No. 201220105396.2, Response filed Aug. 30, 2012 to Office Action mailed Jul. 17, 2012", 36 pgs.

* cited by examiner

GROUND FAULT CIRCUIT INTERRUPTER (GFCI) MONITOR

CLAIM OF PRIORITY

This application claims the benefit of priority under 35 U.S.C. §119(e) of Armstrong U.S. Provisional Patent Application Ser. No. 61/449,489, entitled "GROUND FAULT CIRCUIT INTERRUPTER (GFCI) MONITOR," filed on Mar. 4, 2011, which is incorporated by reference herein in its entirety.

CROSS REFERENCE TO RELATED APPLICATIONS

This application is related to Armstrong U.S. Pat. No. 8,085,516, entitled "GROUND FAULT CIRCUIT INTERRUPTER WITH SELF TEST," filed on Jul. 11, 2008, which is hereby incorporated by reference herein in its entirety.

BACKGROUND

Electrical circuits generally employ one or more protection devices configured to disable power to a load in response to a detected fault condition. One such protection device is a ground fault circuit interrupter (GFCI) controller.

In an example, a GFCI controller can be configured to detect, among other things, a fault, such as a hazardous current path, such as a short or other low impedance or high current path, creating a difference between current flowing from a source, such as a source line (e.g., line hot) of a power outlet receptacle (e.g., 120V, 60 Hz power outlet receptacles, etc.), and current flowing through a return, such as a return line (e.g., line neutral) of the power outlet receptacle, which, if left undetected, can lead to electrocution or electrical shock, to fire, or to damage of one or more coupled electrical components coupled to the power outlet receptacle. Once the fault is detected, the GFCI circuit can be configured to interrupt power from the source, removing the fault.

GFCI manufactures are required to include test and reset buttons, such as the test switch, to manually verify that the GFCI system is working correctly. Certain industry standards recommend that the GFCI system be tested on a monthly basis to ensure proper operation. However, in operation, many GFCI systems are not regularly tested for proper functionality.

Overview

This document discusses, among other things, a self-test (ST) ground fault circuit interrupter (GFCI) monitor configured to generate a simulated ground fault starting in a first half-cycle of a first cycle of AC power and extending into a second half-cycle of the first cycle of AC power, wherein the first half-cycle of the first cycle of AC power precedes the second half-cycle of the first cycle of AC power. Further, the ST GFCI monitor can detect a response to the simulated ground fault.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 8A-11B illustrate generally examples of simulation results for a functional solenoid, a non-functional solenoid, a simulated ground fault, and a non-functional silicon-controlled rectifier (SCR) of a ground fault circuit interrupter (GFCI) application circuit, such as the GFCI application circuit 200 illustrated in the example of FIG. 2.

FIGS. 12A-13B illustrate generally examples of simulation results for a simulated ground fault and or a non-functional silicon-controlled rectifier (SRC) of a ground fault circuit interrupter (GFCI) application circuit, such as the GFCI application circuit 500 illustrated in the example of FIG. 5.

DETAILED DESCRIPTION

Figure 1:
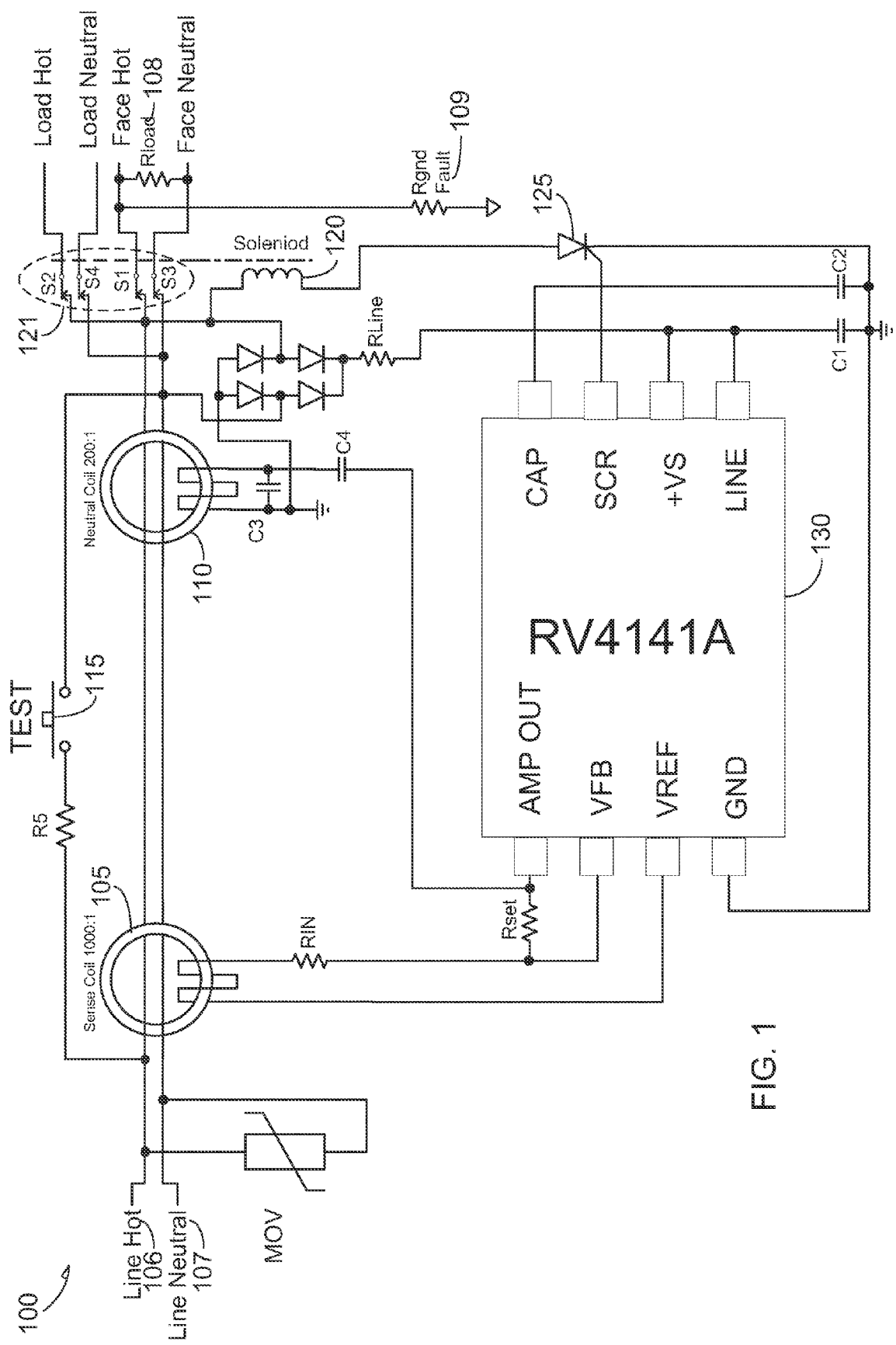
FIG. 1 illustrates generally an example ground fault circuit interrupter (GFCI) application.

FIG. 1 illustrates generally an example ground fault circuit interrupter (GFCI) application 100 including a sense coil 105, a neutral coil 110, a test switch 115, a solenoid 120, switches S1-S4 121, a silicon-controlled rectifier (SCR) 125, and a GFCI controller 130. In the example, the sense coil 105 can be configured to monitor the current difference between a source, such as line hot 106, and a return, such as line neutral 107. If the current difference is zero, then all of the current is flowing to the load, illustrated in FIG. 1 as a load resistance ($R_{load}$) 108. However, if a current difference exists between the source and the return, a leakage current can be present, such as through the ground fault resistor ($R_{gnd}$ Fault) 109 to ground. In an example, the leakage current can be sensed by the sense coil 105 and processed by the GFCI controller 130 (e.g., a Fairchild Semiconductor low-power, ground fault interrupter (GFI) RV4141A product, etc.). If the leakage current exceeds a threshold (e.g., 4 mA RMS, 5 mA RMS, 6 mA RMS, 8 mA RMS, etc.), the GFCI controller 130 can generate a fault signal configured to turn on or enable the SCR 125, which can energize the solenoid 120 to open switches S1-S4 121, ceasing power through the ground fault resistor 109 (e.g., human from load hot to ground electric shock, etc.).

The present inventor has recognized, among other things, a self-test (ST) GFCI monitor that can simulate a ground fault to periodically test the functionality of one or more components of a GFCI system. In an example, the one or more tested components can include one or more critical components of the GFCI system, such as a sense transformer, an SCR, a GFCI controller, a solenoid, a rectifier diode, a current limiter dropping resistor, or one or more other passive or other GFCI circuit components. In certain examples, the GFCI circuit can be configured to test the functionality of the GFCI system components with a minimum number of components, minimum system bill of material (BOM) cost, maximum board space savings, or minimum power consumption, without tripping the load contacts or denying power to the load. In an example, the GFCI circuit can have noise immunity for false phase detection, or false self-test detection, and can provide functional self-testing without compromising normal ground fault detection.

In an example, the ST GFCI monitor, during a positive half-cycle of AC power, when the line hot voltage is positive with respect to the line neutral voltage, can be configured to monitor a voltage at an anode of a silicon-controlled rectifier (SCR) to determine continuity of the SCR and a solenoid configured to couple or decouple AC power to a load. If the voltage does not exceed a threshold (e.g., 85V RMS, between 65V RMS and 105V RMS, etc.), the ST GFCI can provide an indication (e.g., such as an end-of-life (EOL) signal) that one or more component has failed.

In an example, the ST GFCI monitor, starting at the end of the positive half-cycle of AC power and continuing into the subsequent negative half-cycle, can bias the SCR anode, generate a simulated ground fault, and determine if the GFCI controller detects simulated ground fault and enables the SCR in response. In an example, a diode in series with the SCR and the solenoid can prevent the SCR from energizing the solenoid during the negative half-cycle of AC power. Further, even though the simulated ground fault begins at the end of the positive half cycle, in many examples, at the point in which the clock is triggered (e.g., 170°, etc.), there is not enough current to bias the solenoid to interrupt AC power to a load.

Although various examples discussed herein reference specific tests in one or more of the positive or negative half-cycles of AC power, in other examples, the half-cycles reference above can be reversed with several changes in the overall circuit design. In an example, the ST GFCI monitor can be configured to monitor the voltage at the anode of the SCR during a negative half-cycle of AC power, and the ST GFCI monitor can be configured to generate the simulated ground fault at the end of the negative half-cycle of AC power and continue into the subsequent positive half-cycle of AC power.

Further, the present inventors have recognized a two integrated circuit (IC) approach consisting of a GFCI controller and a self-test (ST) GFCI monitor. In an example, the analog ground fault interrupter (GFI) function of the GFCI controller has better performance at a voltage higher than 5V. Accordingly, in certain examples, the GFCI controller can realized using a 15V, low cost, precision bipolar process (BCH5). In contrast, in certain examples, the ST GFCI monitor can require a high number of digital gates (e.g., 500, etc.), and accordingly, the 15V, low cost, precision bipolar process (BCH5) cannot be used. Also, by separating the GFCI controller and the ST GFCI monitor into separate ICs, the low cost and high density package (e.g., SSOT6, etc.) can be used for each IC. In an example, the cost of two SSOT6 packages can be less than a single, larger package having enough pins required for all functions of the combined device (e.g., MLP14, SOIC14, etc.). In other examples, the two IC approach can provide greater board layout flexibility, or can allow for customers to add only the ST GFCI monitor IC to their existing GFCI applications. Moreover, in failure mode, in the case of ST GFCI monitor circuit failure, the GFCI controller operation is not affected, in contrast with single IC approaches where a fault in the ST GFCI electronics could negatively impact the entire IC. Thus, the two IC approach can increase the overall safety and robustness of GFCI applications.

In certain examples, following detection of one or more failed GFCI tests, or detection of one or more failed GFCI system components, the GFCI circuit can be configured to generate a latched end-of-life (EOL) indicator, such as an EOL indicator alarm or other signal. The latched EOL indicator can be reset using, among other things, an under voltage power-on reset (POR) detection signal. In an example, the latched EOL indicator can be reset with detection of a manual self-test cycle, or normal ground fault and opening of the load contacts.

Figure 2:
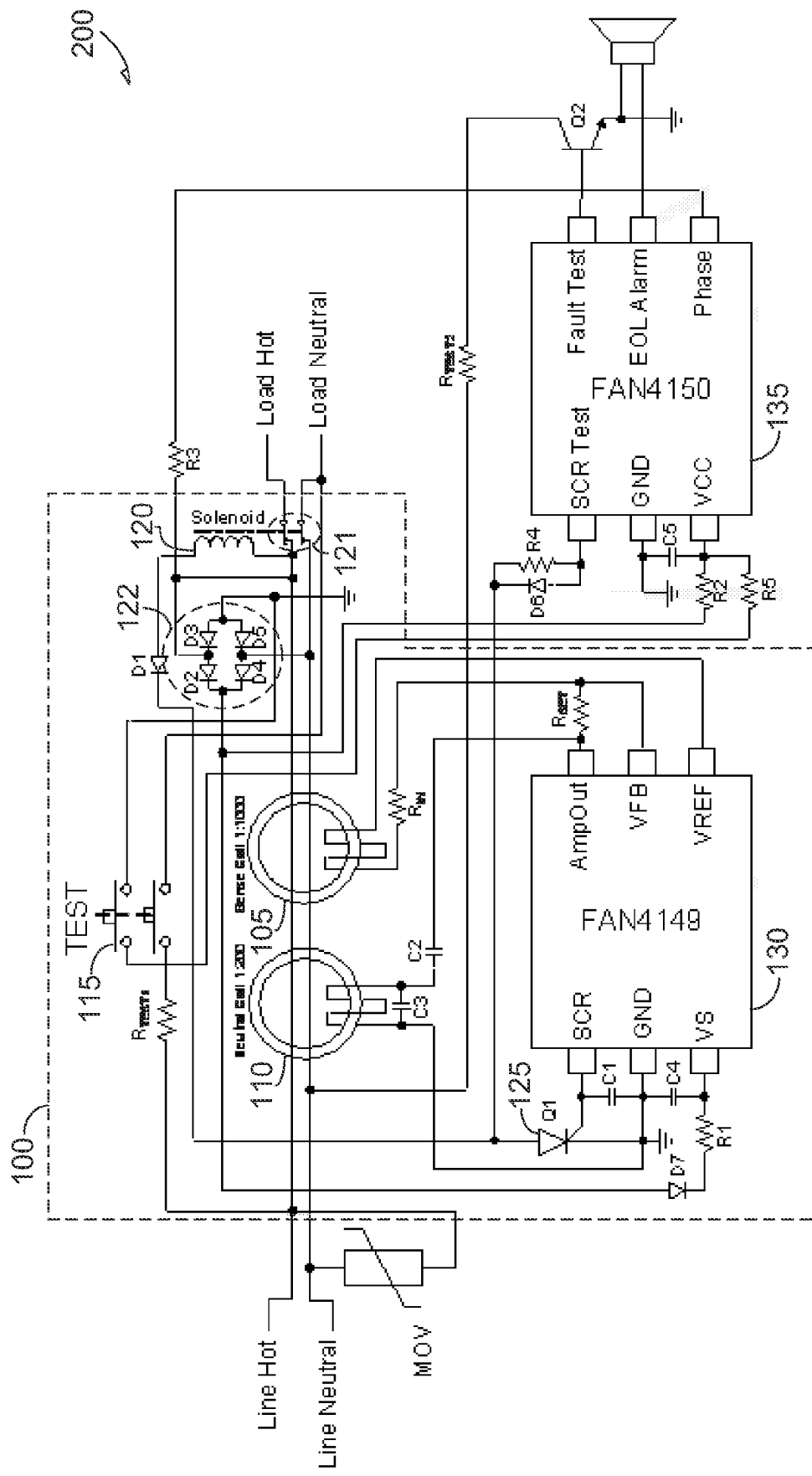
FIG. 2 illustrates generally an example of a ground fault circuit interrupter (GFCI) application circuit configured to perform a self-test operation during the positive and negative half-cycles of AC power.

FIG. 2 illustrates generally an example of a ground fault circuit interrupter (GFCI) application circuit 200 configured to perform a self-test operation during the positive and negative half-cycles of AC power. The GFCI application circuit 200 includes a self-test (ST) GFCI monitor 135 (e.g., a Fairchild Semiconductor FAN4150 self-test GFI monitor) coupled to a GFCI application 100, the GFCI application 100 including a GFCI controller 130 (e.g., a Fairchild Semiconductor FAN4149 GFI controller). In the example of FIG. 2, the ST GFCI monitor 135 includes a separate IC coupled to the GFCI application 100. In other examples, the GFCI controller 130, or one or more other GFCI application 100 components, can include the ST GFCI monitor 135.

In an example, the GFCI application 100 can include a test switch 115 configured to trigger a manual self-test, generating a ground fault current through a test resistor ($R_{TEST1}$) and resetting the ST GFCI monitor 135. The simulated ground fault current can create a differential current in a sense coil 105 that can be detected by the GFCI controller 130. If the ground fault current exceeds a threshold set by a set resistor ($R_{SET}$), the GFCI controller 130 can output a high signal to the gate of a silicon-controlled rectifier (SCR) 125. The SCR 125 can energize a solenoid 120 and open load contacts (e.g., switches 121), removing the ground fault and verifying that the GFCI application 100 is working correctly.

In other examples, one or more other semiconductor switches can be used in place of the SCR 125 throughout, or the load contacts can include one or more other relays, etc.

The ST GFCI monitor 135 can be configured to periodically monitor components of the GFCI application 100 without opening the load contacts and interrupting power to the load. When power is first applied to the line terminals, the ST GFCI monitor 135 can be powered using full-wave bridge diodes (D2-D5) 122 and a resistor (R2). In an example, the ST GFCI monitor 135 can include an under-voltage lock-out (UVLO) detection circuit configured to reset all logic when the VCC voltage reaches a threshold, such as approximately 2.5 Volts. The ST GFCI monitor 135 can include a 5.25 Volt shunt regulator that can clamp the VCC voltage. In certain examples, the ST GFCI monitor 135 can be triggered after one or more time thresholds, for example, to ensure proper operation following power-on or reset, and periodically thereafter. In an example, the ST GFCI monitor 135 can be triggered one second following power-on or reset and every 90 minutes thereafter. In other examples, one or more other time thresholds or periods can be used ranging from fractions of seconds to days or months.

In an example, a diode (D1) can prevent the anode of the SCR 125 from energizing the solenoid 120 during the negative half-cycle of AC power. In certain examples, resistors illustrated in FIG. 2 (R2-R5) can include values of 75 kΩ, 1 MΩ, 1 MΩ, and 100Ω, respectively, a test resistor ($R_{TEST2}$) can include a value of 15 kΩ a capacitor (C5) can include a value of 1 µF, and a transistor (Q2) can include FMMT458. In other examples, one or more other components or component values can be used.

Figure 3:
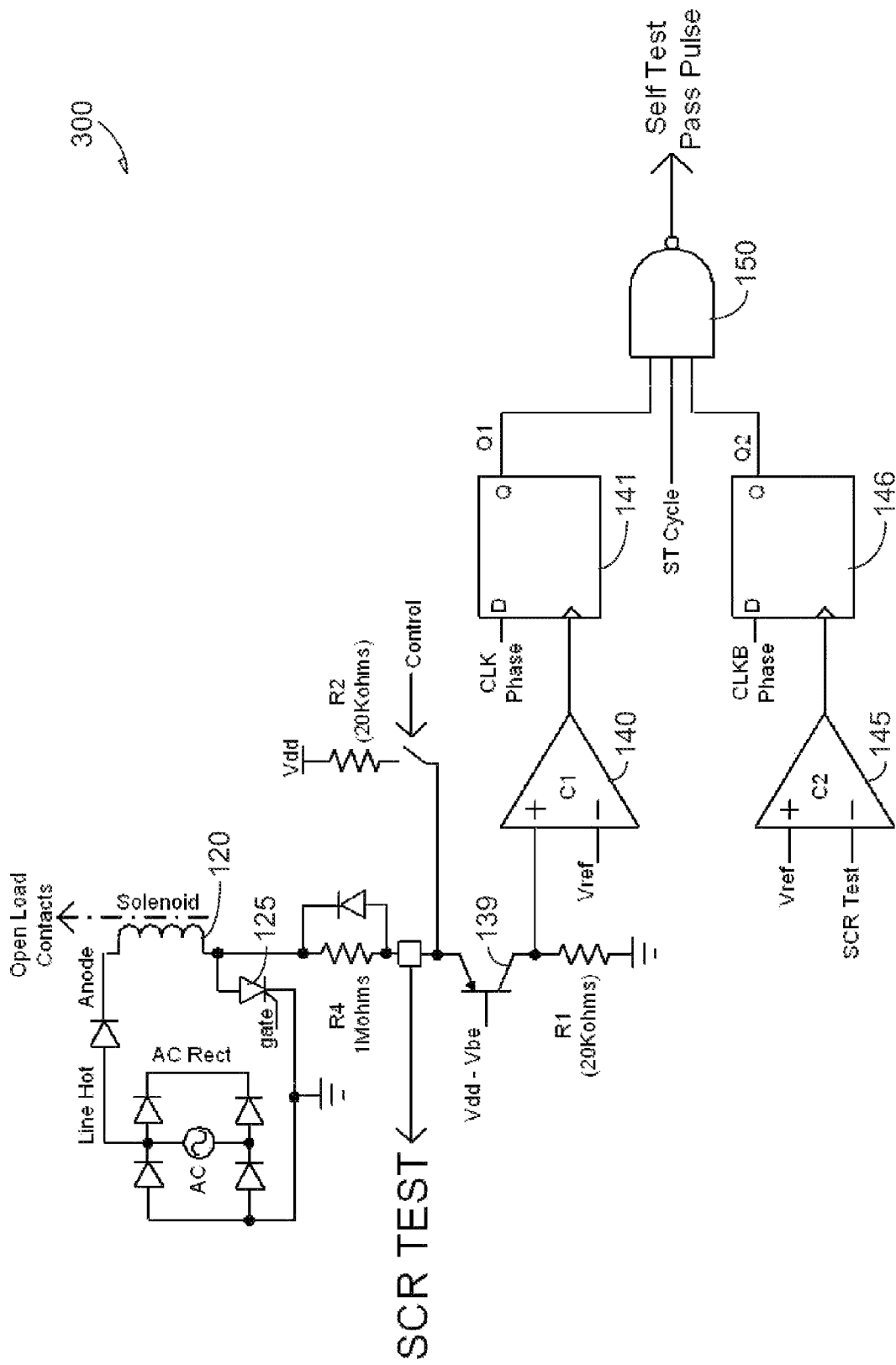
FIG. 3 illustrates generally an example of a ground fault circuit interrupter (GFCI) detection circuit configured to verify the functionality of several GFCI detection circuit components, for example, without opening load contacts of the GFCI detection circuit.

FIG. 3 illustrates generally an example of a ground fault circuit interrupter (GFCI) detection circuit 300 configured to verify the functionality of several GFCI detection circuit components, for example, without opening load contacts of the GFCI detection circuit 300. In an example, when clock phase (CLK Phase) is high (e.g., with a reference voltage (Vref) at approximately 2.1 Volts, etc.), and the output of the first comparator (C1) 140 is high, such as when VAC (e.g., the voltage on line hot) is above 80V RMS or one or more other threshold, the output (Q1) of the first flip flop 141 can be high. In other examples, one or more other resistor values or reference voltages can be used. Similarly, in an example, when clock B phase (CLKB Phase) is high, a second comparator (C2) 145 can go high when a silicon-controlled rectifier (SCR) 125 is triggered and SCR Test goes low, the output (Q2) of the second flip flop 146 can be high. A self-test pulse can trigger a one shot that can set the pass self-test cycle latch.

In an example, the self-test cycle can start when the clock signal is high, which means that VAC is starting a positive half-cycle of AC power (e.g., line hot is positive with respect to line neutral). An anode of the solenoid 120 can be charged to a high voltage by a diode connected to the line hot voltage. The solenoid 120 can be coupled to an SCR TEST pin of an ST GFCI monitor through a resistor (R4). In an example, the SCR TEST pin can be clamped to VDD (e.g., 5.25V), such as by a PNP transistor 139, or by one or more other components (e.g., a PMOS transistor, a JFET transistor, etc.), and can mirror the current at the SCR TEST pin into a detection circuit, such as the first comparator (C1) 140. The current flowing through resistor R4 can flow to resistor R1. In an example, the ratio of resistors R4/R1 can be 50:1, such that when the voltage on the solenoid 120 connected to the anode of the SCR 125 exceeds 110 volts, the first comparator (C1) 140 can output a high signal into the first flip flop 141. Since this occurs when the clock is high, the output (Q1) of the first flip flop 141 can go high, which can trigger a check of the functionality of the solenoid 120 or other circuits for functional or non-functional operations.

During a negative half-cycle of AC power, when clock B is high, the diode between line hot and the anode of the solenoid 120 can be reversed biased, restricting current from flowing through the solenoid 120. When clock B is high, a ground fault signal can be simulated, such as by using a transistor (Q2) and a resistor ($R_{TEST2}$) from the example of FIG. 2. In an example, the ST GFCI monitor 135 can generate a high signal for pin "Fault Test" to enable the transistor (Q2) and generate a simulated ground fault. In an example, the ground fault can be simulated starting at the end of the positive half-cycle of AC power (e.g., at approximately 165°, when clock B transitions) and typically ending during the negative half-cycle when the SCR 125 is triggered (e.g., generally, in the first half of the negative half-cycle of AC power, such as at approximately 225°, etc.). However, if the SCR 125 does not trigger, such as during a self-test failure, the self-test cycle can end at or near the start of the next positive half-cycle of AC power (e.g., at approximately 1° of the next negative half-cycle).

At the end of the positive half-cycle, a control signal can bias the SCR TEST pin at a voltage equal to VDD, such as by using resistor R2, simulating a ground fault. The simulated ground fault can cause a GFCI controller to enable the SCR 125. In an example, the second comparator (C2) 145 can be configured to sense the SCR TEST during the simulated ground fault. However, when the SCR 125 is enabled, the SCR TEST node voltage can be discharged and the output of the second comparator (C2) 145 can go high. In an example, this can occur when clock B is high and logic signal Q2 of the second flip flop 146 is latched high. When all three inputs to a NAND gate 150 are high, a Self-test Pass Pulse can be generated to trigger a self-test pass state.

If either of output (Q1 or Q2) of the first or second flip flops 141, 146 fails to go to a logic high state during the self-test cycle, an end-of-life (EOL) signal can be enabled. In other examples, the EOL criteria must be sustained for a threshold number of successive cycles (e.g., 4, etc.) before the EOL signal can be enabled to ensure accurate EOL detection. The EOL signal can occur after a time-out circuit expires (e.g., 66 ms, etc.) during a self-test cycle time window. In certain examples, the EOL signal can be a visual or audio generated signal. The EOL signal can also be used to trigger the SCR during the positive half-cycle and open the load contacts.

In an example, the self-tests described above can test various components (e.g., key components) of a GFCI application circuit, such as the GFCI controller 130, the resistor R1, the diode D7, the SCR 125, the sense coil 105, the solenoid 120, or one or more components illustrated herein.

Figure 4:
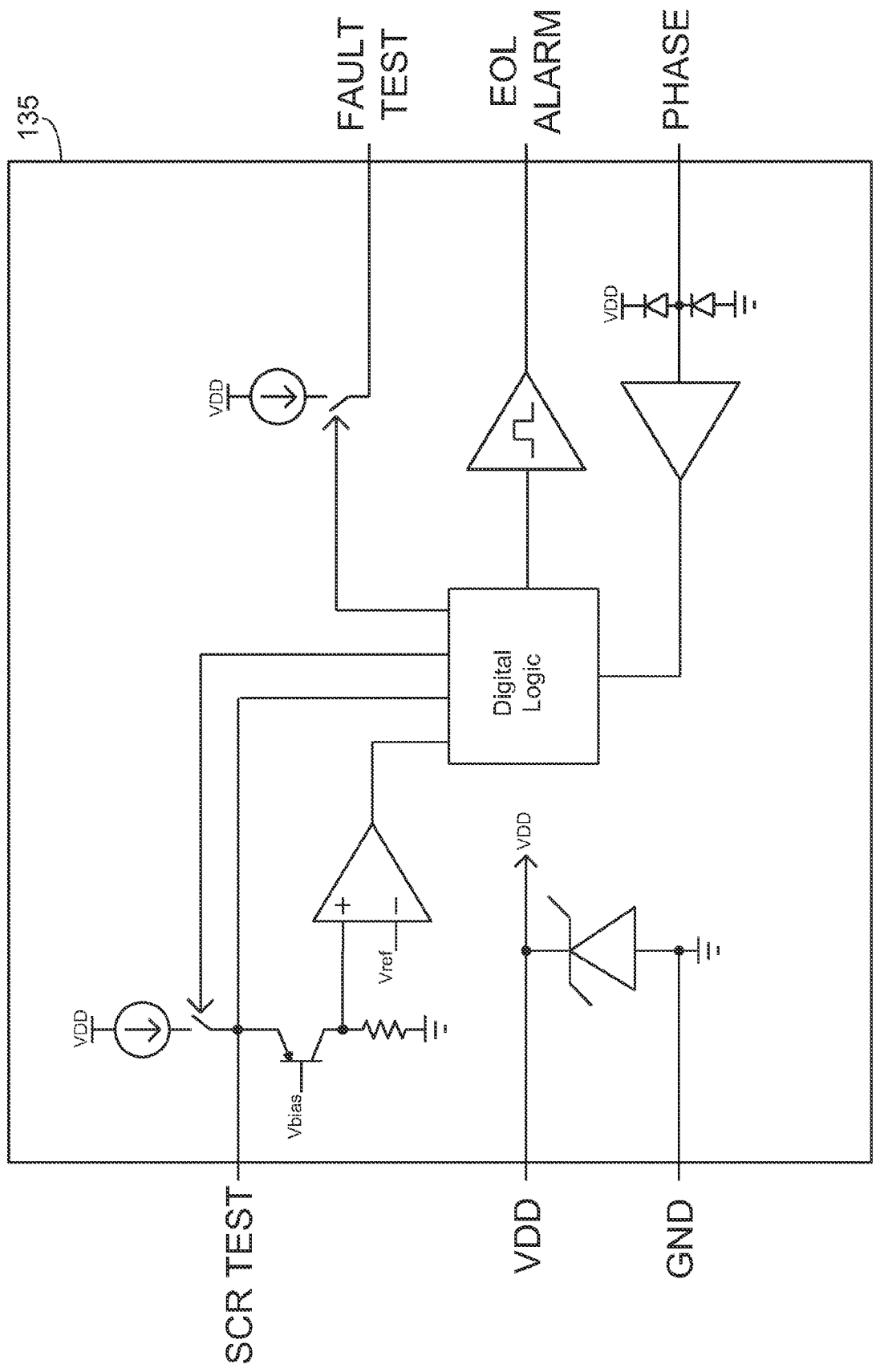
FIG. 4 illustrates generally an example of a self-test (ST) ground fault circuit interrupter (GFCI) monitor configured to provide an end-of-life (EOL) signal.

FIG. 4 illustrates generally an example of a self-test (ST) ground fault circuit interrupter (GFCI) monitor 135 configured to provide an end-of-life (EOL) signal. In this example, the phase of the VAC input is the clock signal, high during the positive half-cycle and low during the negative half-cycle. In certain examples, the clock detection can only occur near the beginning and end of the positive half-cycle because one or more components are biased from a positive VCC (e.g., 5.25 Volts) and the logic input threshold is typically VCC/2. Accordingly, as a tradeoff to simple and robust phase detection, clock transitions may not occur exactly at the zero crossing.

Figure 5:
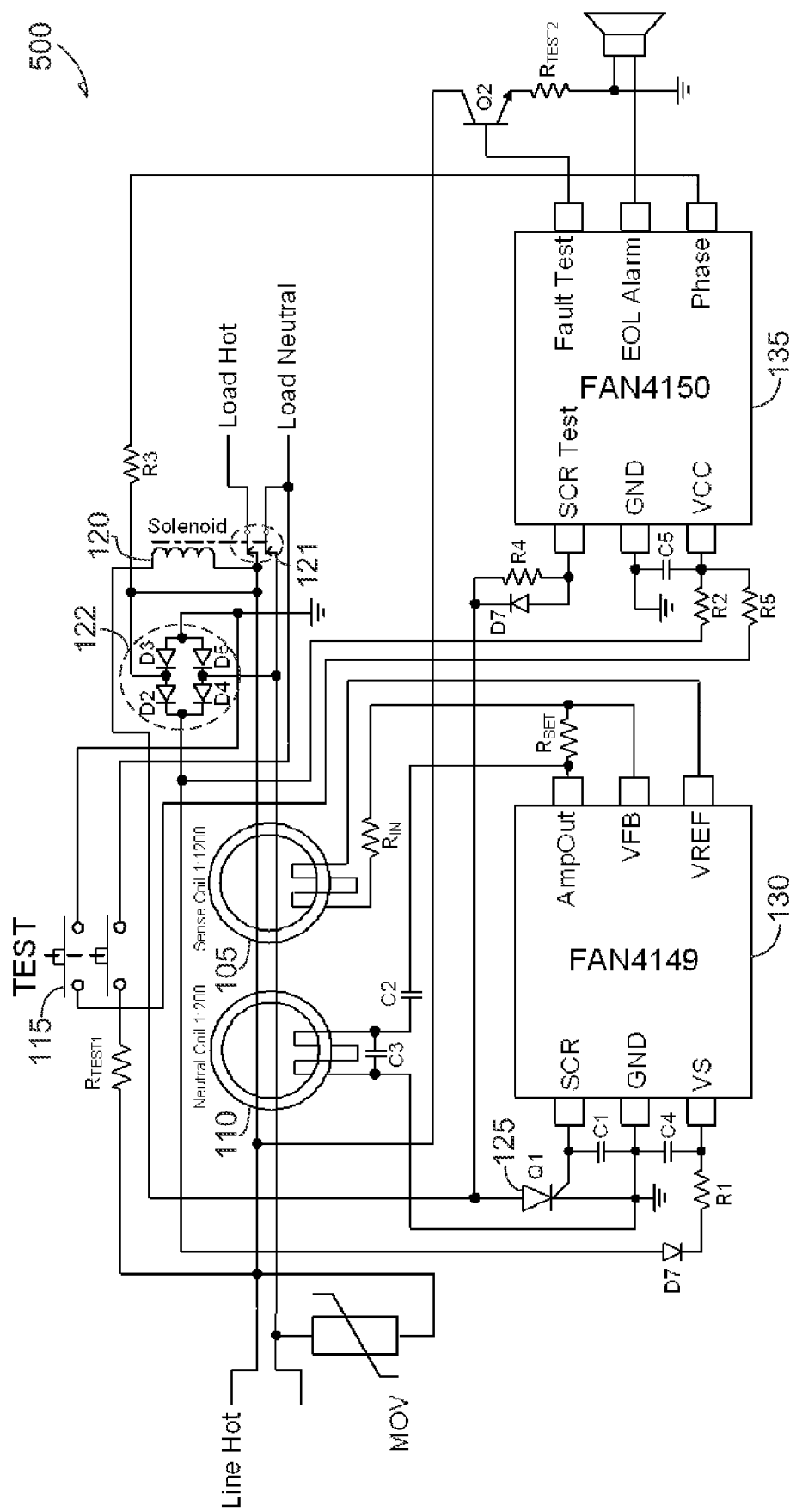
FIG. 5 illustrates generally an example of a ground fault circuit interrupter (GFCI) application circuit configured to perform a self-test operation during the positive half-cycle of AC power, and not during the negative half-cycle of AC power.

FIG. 5 illustrates generally an example of a ground fault circuit interrupter (GFCI) application circuit 500 configured to perform a self-test operation during the positive half-cycle of AC power, and not during the negative half-cycle of AC power. The GFCI application circuit 500 includes a self-test (ST) GFCI monitor 135 (e.g., a Fairchild Semiconductor FAN4150 self-test component) coupled to a GFCI application 100, the GFCI application 100 including a GFCI controller 130 (e.g., a Fairchild Semiconductor FAN4149 GFI controller).

The GFCI application circuit 500 includes a solenoid 120 directly coupled to an anode of a silicon-controlled rectifier (SCR) 125. In contrast to the example of FIG. 2, the GFCI application circuit 500 does not include a diode coupled between the solenoid 120 and the SCR 125. Accordingly, the fault current in the GFCI application circuit 700 is independent of VAC.

In an example, a self-test of the key components of the GFCI application circuit 500 can be performed without biasing the solenoid 120 and opening the load contacts (e.g., switches 121). The solenoid 120 typically requires 1 to 3 amps of bias current to open the load contacts. In an example, the functionality of the key components of the GFCI application circuit 500 can be checked at the end of the positive half-cycle, where line hot cannot supply enough power to operate the solenoid 120, but before the zero crossing point.

The ST GFCI monitor 135 can generate a high signal for pin "Fault Test" to enable transistor Q2 and generate a simulated ground fault. The transistor Q2 can be configured as an emitter follower, and a collector current can flow independent of the VAC voltage during the positive half-cycle, provided that the VAC voltage is greater than VCC (5.25 volts). In certain examples, the collector current can be user programmable by resistor $R_{TEST2}$. In an example, resistor $R_{TEST2}$ can have a value (e.g., approximately 200Ω, etc.) selected to provide a collector current (e.g., 15 mA, etc.) sufficient such that the GFCI controller 130 can detect a ground fault using the sense coil 105. In certain examples, once the simulated ground fault has been detected, the GFCI controller 130 can trigger an internal time delay circuit and enable the gate of the SCR 125 when the VAC voltage reaches a threshold, such as 30 volts, etc. When the SCR 125 is enabled, it can discharge the anode of the SCR 125, for example, to a level of about 1 volt, etc.

Figure 6:
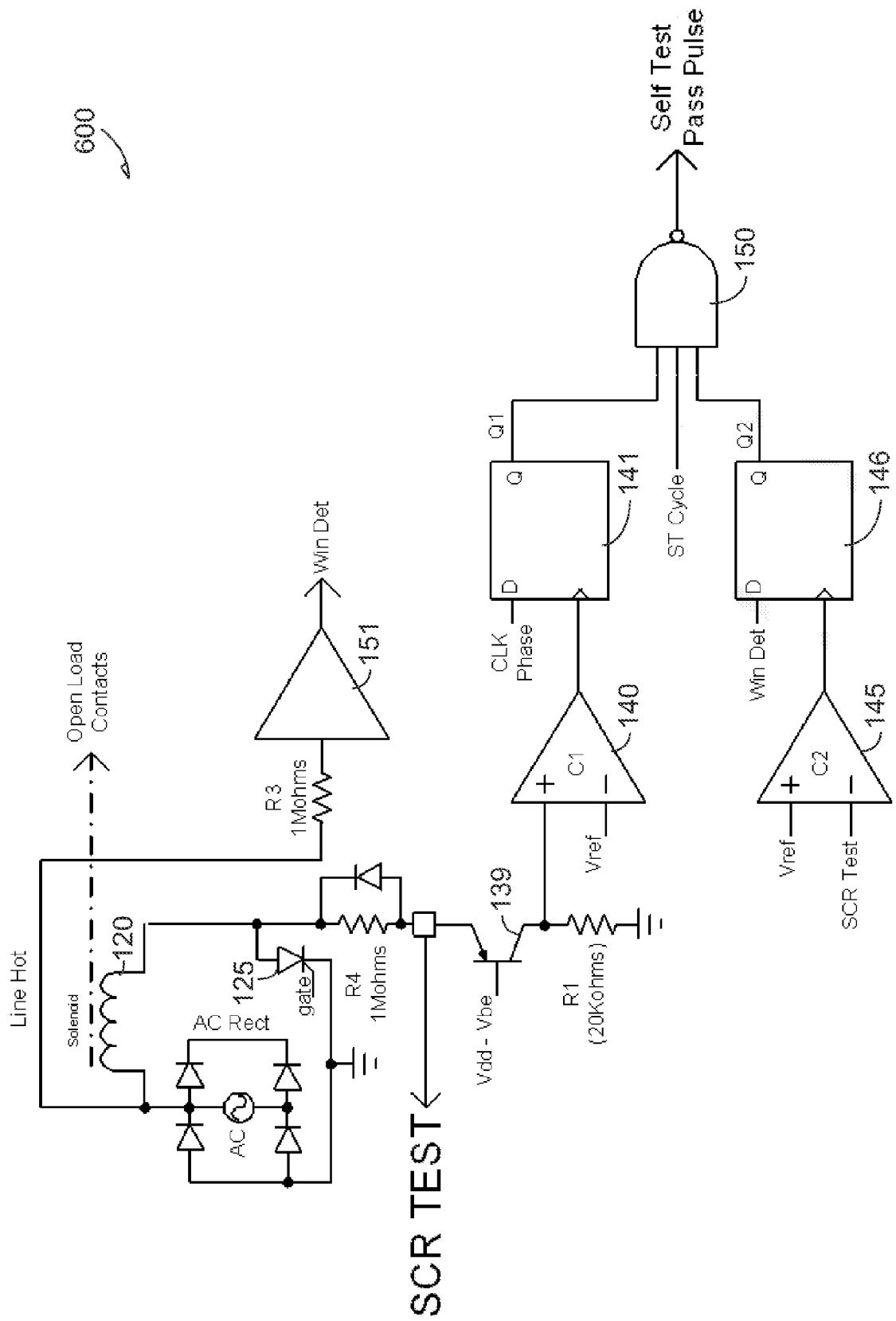
FIG. 6 illustrates generally an example of a ground fault circuit interrupter (GFCI) detection circuit configured to verify the functionality of several GFCI detection circuit components, for example, without opening load contacts of the GFCI detection circuit.

FIG. 6 illustrates generally an example of a ground fault circuit interrupter (GFCI) detection circuit 600 configured to verify the functionality of several GFCI detection circuit 600 components, for example, without opening load contacts of the GFCI detection circuit 600. In an example, when clock phase (CLK Phase) is high, with Vref approximately 2.1 Volts, a first comparator (C1) 140 can go high when VAC is above 110V, setting the output (Q1) of the first flip flop 141 high. When line hot is between 8 and 30 Volts, a silicon-controlled rectifier (SCR) 125 can be enabled and a second comparator (C2) 145 can detect when the SCR 125 is triggered, setting the output (Q2) of the second flip flop 146 high. In an example, a self-test pulse can trigger a one shot that can set the pass self-test cycle latch.

In an example, the GFCI detection circuit 600 can include a window detector 151 configured to generate a window detection pulse (Win Det) when the VAC line voltage is in the positive half-cycle and between one or more thresholds, such as between approximately 90 and 10 volts, or between one or more other thresholds. In an example, the window detection pulse can be user programmable, such as using an external resistor (e.g., resistor R4, etc.).

In an example, when the SCR 125 of the example of FIG. 5 is enabled, such as during the simulated ground fault test, the second comparator (C2) 145 can output a logic high signal. Since, in an example, the window detection pulse (Win Det) is high, the output (Q2) of the second flip flop 146 can be latched to logic high. In an example, the output (Q1) of the first flip flop 141 can already be latched to logic high, such as described above with respect to FIGS. 2-3, and accordingly, a self-test pass pulse can be generated using a NAND gate 150.

In an example, the self-test pass pulse can reset the self state periodic timer. In an example, because the impedance of a solenoid 120 at 60 Hz can typically be greater than 50 ohms, less than 1 A of current can flow through the solenoid 120, which, in certain examples, is not enough current bias to open load contacts 121.

Figure 7:
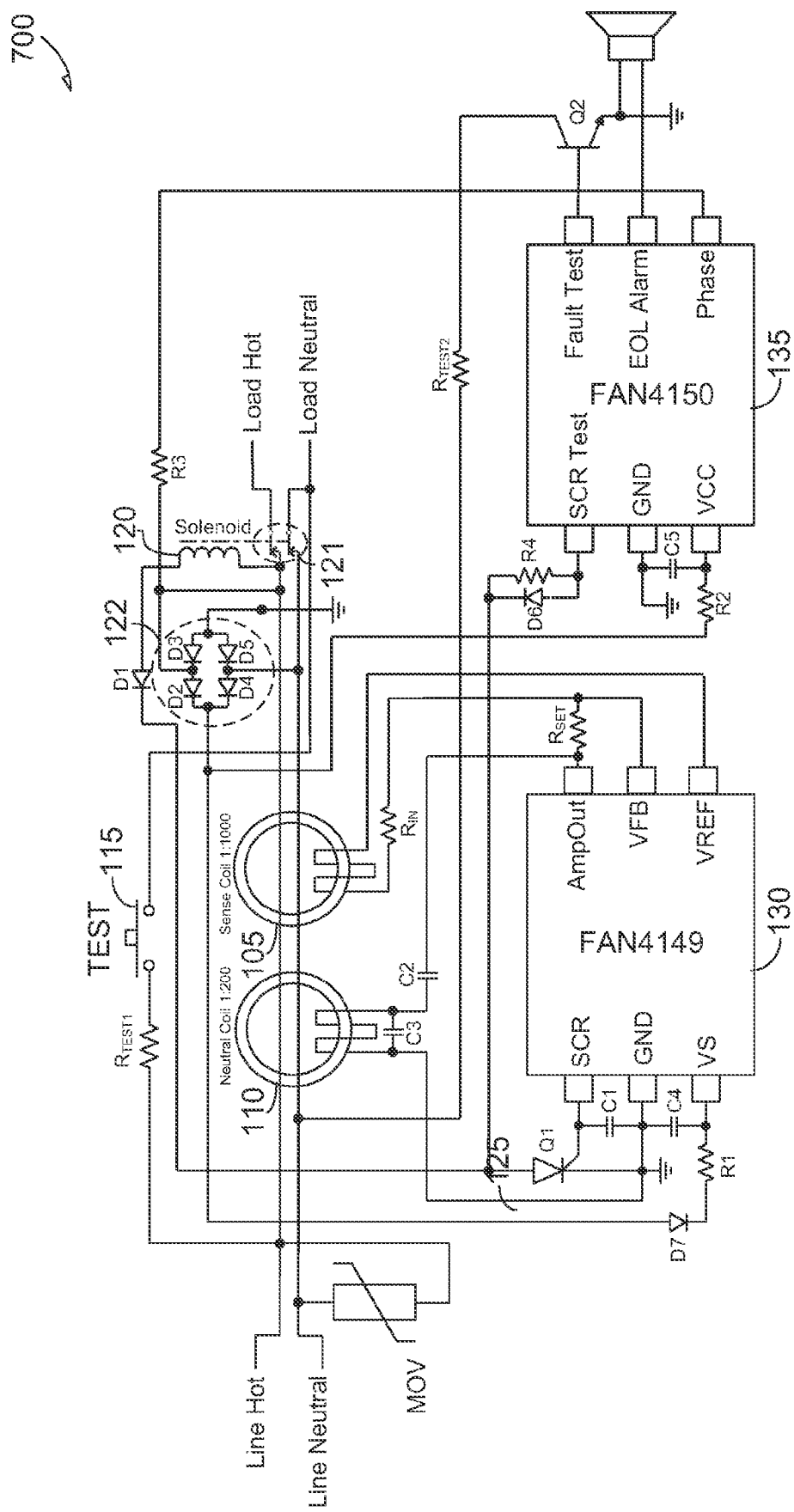
FIG. 7 illustrates generally an example of a ground fault circuit interrupter (GFCI) application circuit configured to perform a self-test operation without the need for a power-on reset (POR).

FIG. 7 illustrates generally an example of a ground fault circuit interrupter (GFCI) application circuit 700 configured to perform a self-test operation without the need for a power-on reset (POR). The GFCI application circuit 700 includes a self-test (ST) GFCI monitor 135 (e.g., a Fairchild Semiconductor FAN4150 self-test component) and a GFCI controller 130 (e.g., a Fairchild Semiconductor FAN4149 GFI controller).

In the example of FIG. 2, if the test switch 115 is pressed, a manual self-test can be initiated and a POR cycle of the ST GFCI monitor 135 can be triggered by the discharge of a capacitor (C5) by means of a resistor (R5). This approach can allow the consumer to reset the end-of-life (EOL) alarm if a false alarm has occurred. However, in certain examples, this approach can require a double pole reset switch that is more expensive and requires more board space versus a single pole switch.

In contrast, in an example, the GFCI application circuit 700 can include a single-pole test switch 115 configured to generate a manual self-test when pressed. However, in certain examples, the ST GFCI monitor 135 can only detect a POR (and reset the logic) if power is disconnected from the VAC input terminals.

When a normal ground fault occurs during the positive half-cycle of AC power, the GFCI controller 130 can sense the ground fault current and enable a silicon-controlled rectifier (SCR) 125. The SCR 125 can discharge the anode voltage (e.g., typically, to less than 3 volts). The SCR Test pin of the ST GFCI monitor 135 can be discharged to a low voltage by a coupled diode (D6) and a resistor (R4). Normally, this voltage will be high (clamped at 5.25 volts) during the positive half-cycle of AC power. The ST GFCI monitor 135 logic can detect that the SCR TEST pin voltage has discharged during a "non" self-test cycle and can detect that a normal ground fault has occurred. In an example, the logic circuit for this detection can also be configured to distinguish between a manual ground fault interrupter (GFI) test, a defective connection on a solenoid 120 (e.g., an open circuit), and an auto self-test cycle test.

In an example, the ST GFCI monitor 135 can be configured to differentiate between a manual self-test and an open solenoid 120, for example, by looking for specific detection patterns. In an example, the ST GFCI monitor 135 can detect four consecutive SCR high pulses followed by a low SCR detection during the AC positive half-cycle. In certain examples, the ST GFCI monitor 135 can include one or more set-reset (SR) latches for detecting an SCR voltage state during a positive AC half-cycle and a five bit serial-in parallel-out shift register. The ST GFCI monitor 135 can detect when four high states are followed by a low state, and make decisions using said information. In other examples, one or more other latches or registers can be used to detect one or more other number of states.

Further, the ST GFCI monitor 135 can be configured to differentiate between a manual test and an automatic self-test, and can disable a "Reset" signal of the five bit shift register of the example discussed above, for example, if an auto self-test cycle is in progress.

FIGS. 8A-11B illustrate generally examples of simulation results for a functional solenoid, a non-functional solenoid, a simulated ground fault, and a non-functional silicon-controlled rectifier (SCR) of a ground fault circuit interrupter (GFCI) application circuit, such as the GFCI application circuit 200 illustrated in the example of FIG. 2.

Figures 8A, 8B:
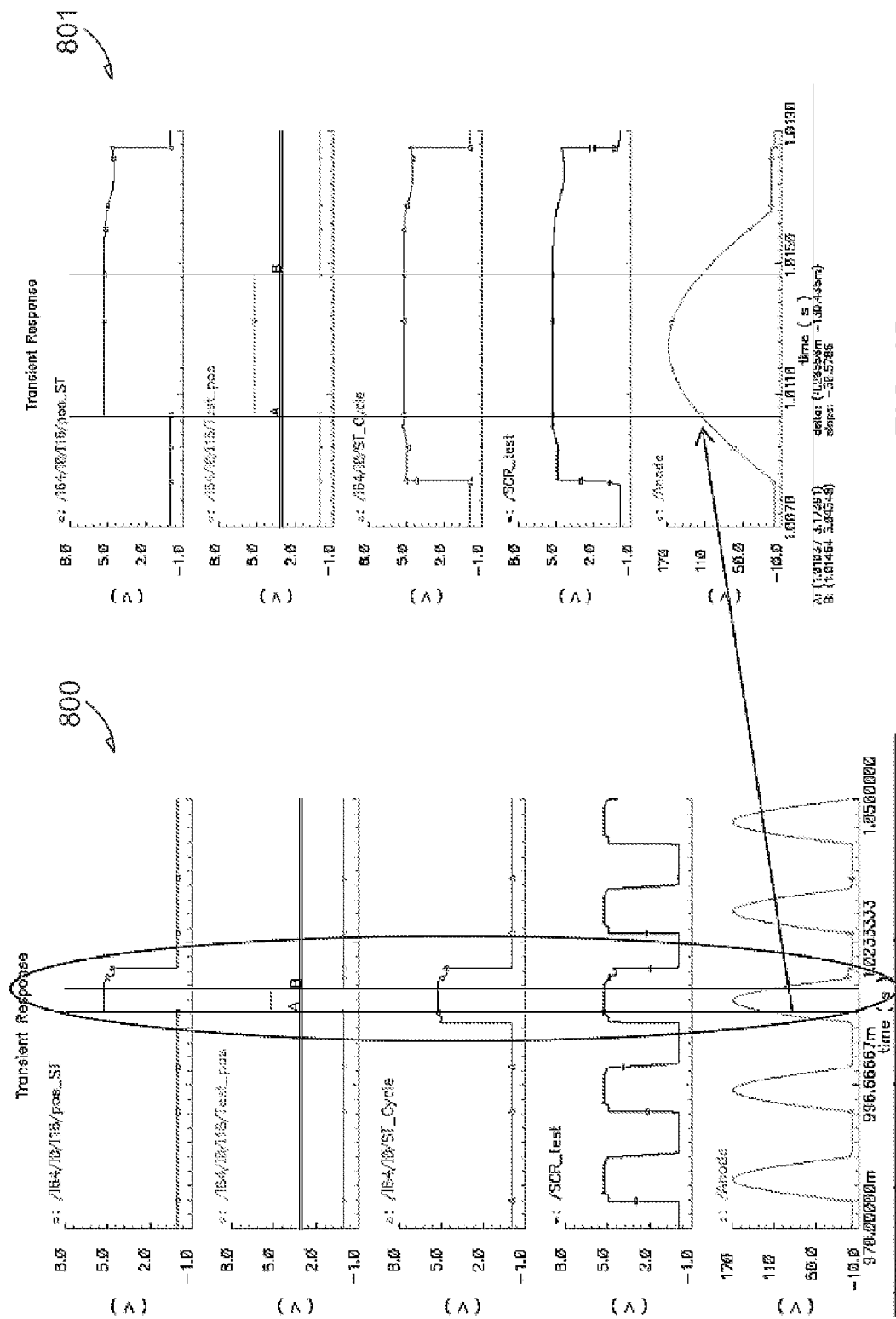

FIG. 8A illustrates generally an example of simulation results 800 of a solenoid test for normal functionality. In an example, a silicon-controlled rectifier (SCR) anode voltage can be checked during a positive half-cycle of AC voltage. In an example, a comparator (C1) can detect an SCR anode voltage greater than a threshold (e.g., 110V, etc.).

Figure 9:
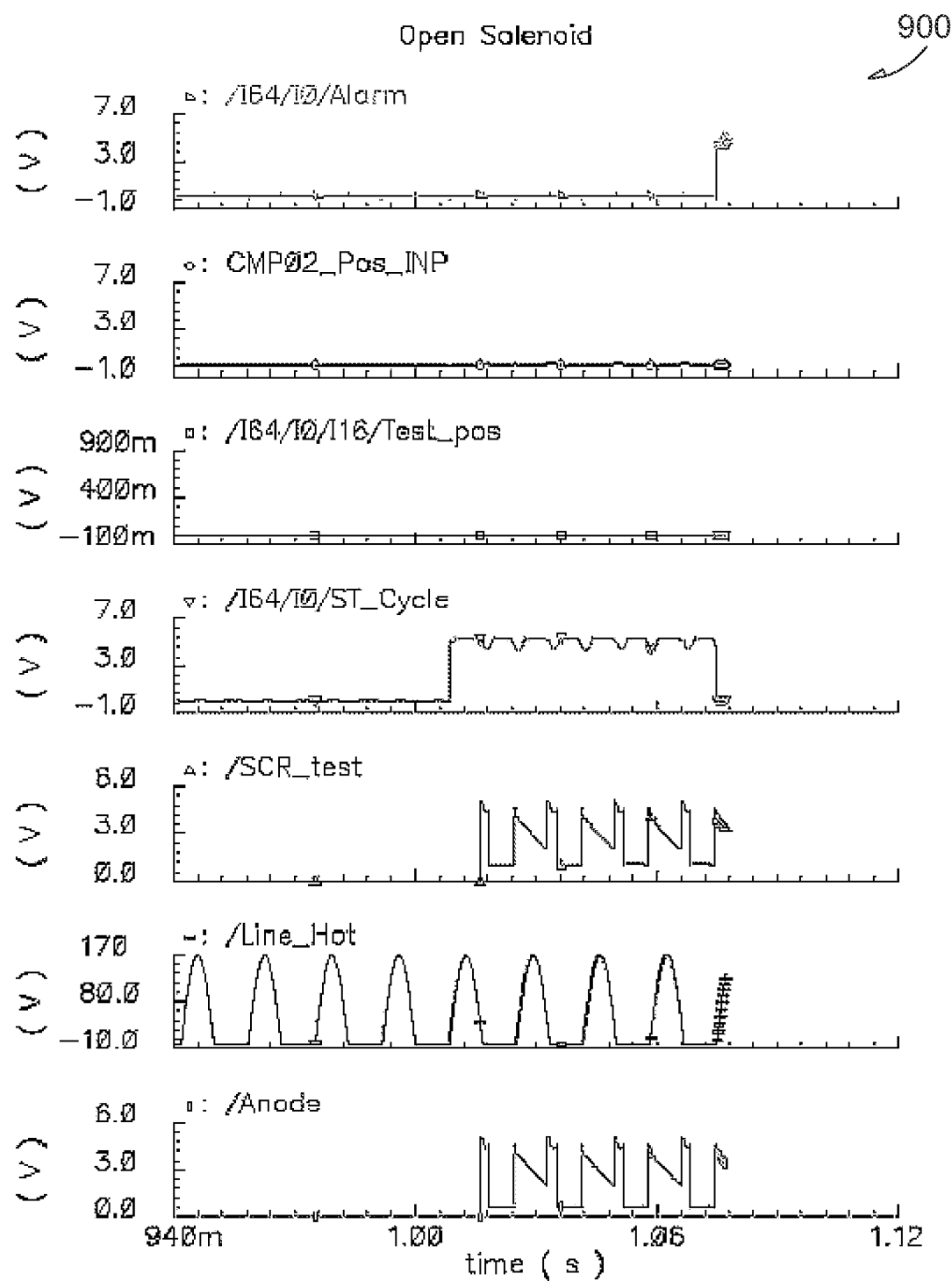

FIG. 8B illustrates generally an example of simulation results 801 including an exploded view of a portion of the simulation results 800 illustrated in FIG. 8A FIG. 9 illustrates generally an example of simulation results 900 of a solenoid test for non-functionality. In an example, at ST_Cycle, detection logic (e.g., the logic of a ground fault circuit interrupter (GFCI) detection circuit, such as the GFCI detection circuit 300 illustrated in the example of FIG. 3, etc.) can require a self-test to pass within a certain number of clock cycles (e.g., 4 clock cycles) or an end-of-life (EOL) signal or alarm can be generated or latched. In an example, a silicon-controlled rectifier (SCR) anode voltage can be checked during a positive half-cycle, and a comparator (C1) may never cause the output (Q1) of a first flip flop to latch high.

Figures 10A, 10B:
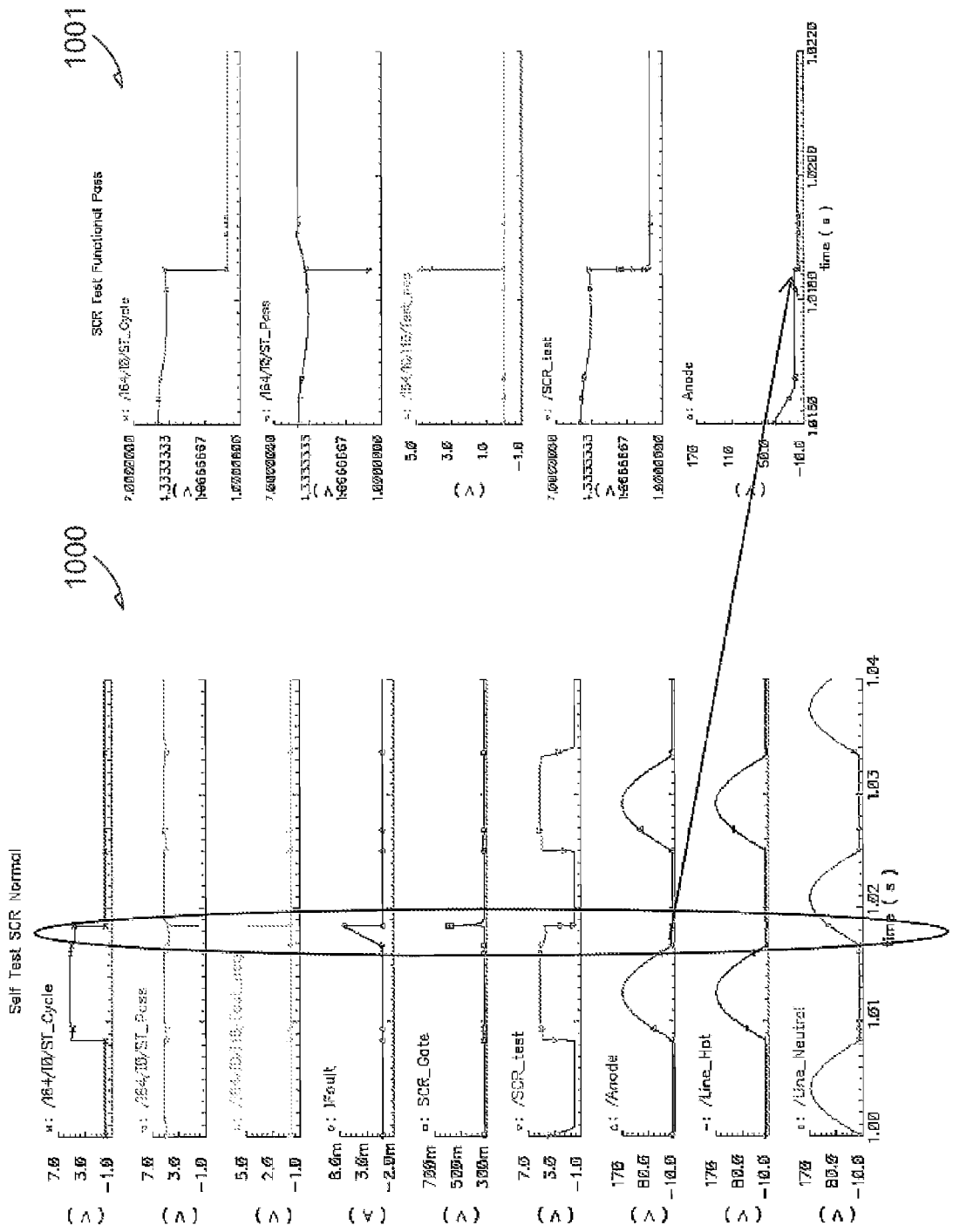
Figures 11A, 11B:
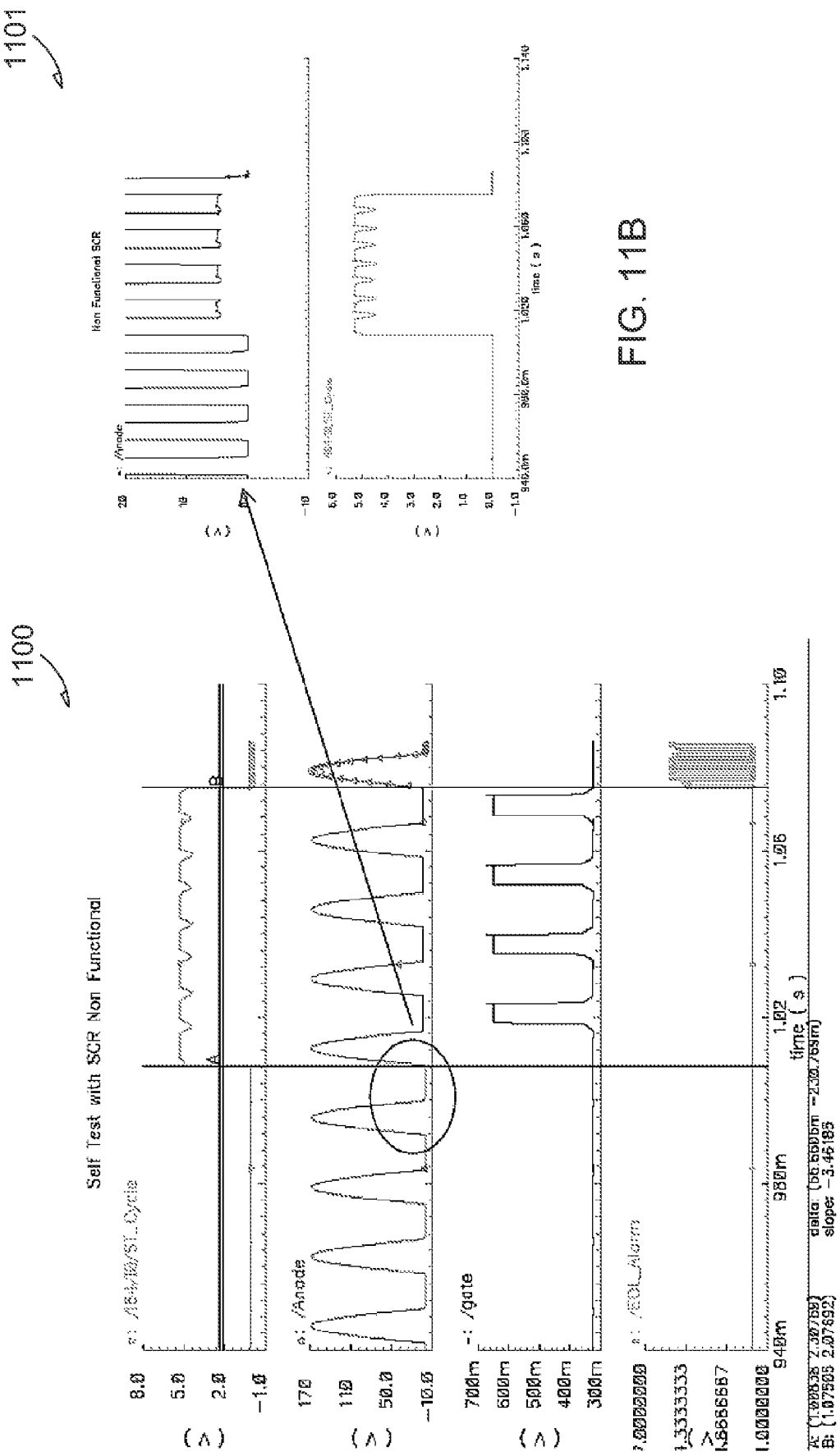

FIG. 10A illustrates generally an example of simulation results 1000 of a simulated ground fault. In an example, the simulated ground fault can test for normal functionality of a silicon-controlled rectifier (SCR), a ground fault circuit interrupter (GFCI) controller, a sense coil, etc., such as those illustrated in the example of FIG. 2. In an example, the SCR can trigger during a negative half-cycle, and a comparator (C2) can detect a discharging SCR anode voltage.

FIG. 10B illustrates generally an example of simulation results 1001 including an exploded view of a portion of the simulation results 1000 illustrated in FIG. 10A

FIG. 11 illustrates generally an example of simulation results 1100 of a non-functional silicon-controlled rectifier (SCR), a ground fault circuit interrupter (GFCI) controller, or a sense coil. In an example, during an SCR test, an SCR anode voltage can be biased and detection logic (e.g., the logic of the GFCI detection circuit 300 illustrated in the example of FIG. 3) can detect if the SCR triggers. If the SCR test does not pass within a threshold number of clock cycles (e.g., 4 clock cycles, etc.), an end-of-life (EOL) signal or alarm can be generated and, in certain examples, latched on.

FIGS. 12A-13B illustrate generally examples of simulation results for a simulated ground fault and or a non-functional silicon-controlled rectifier (SRC) of a ground fault circuit interrupter (GFCI) application circuit, such as the GFCI application circuit 500 illustrated in the example of FIG. 5.

Figures 12A, 12B:
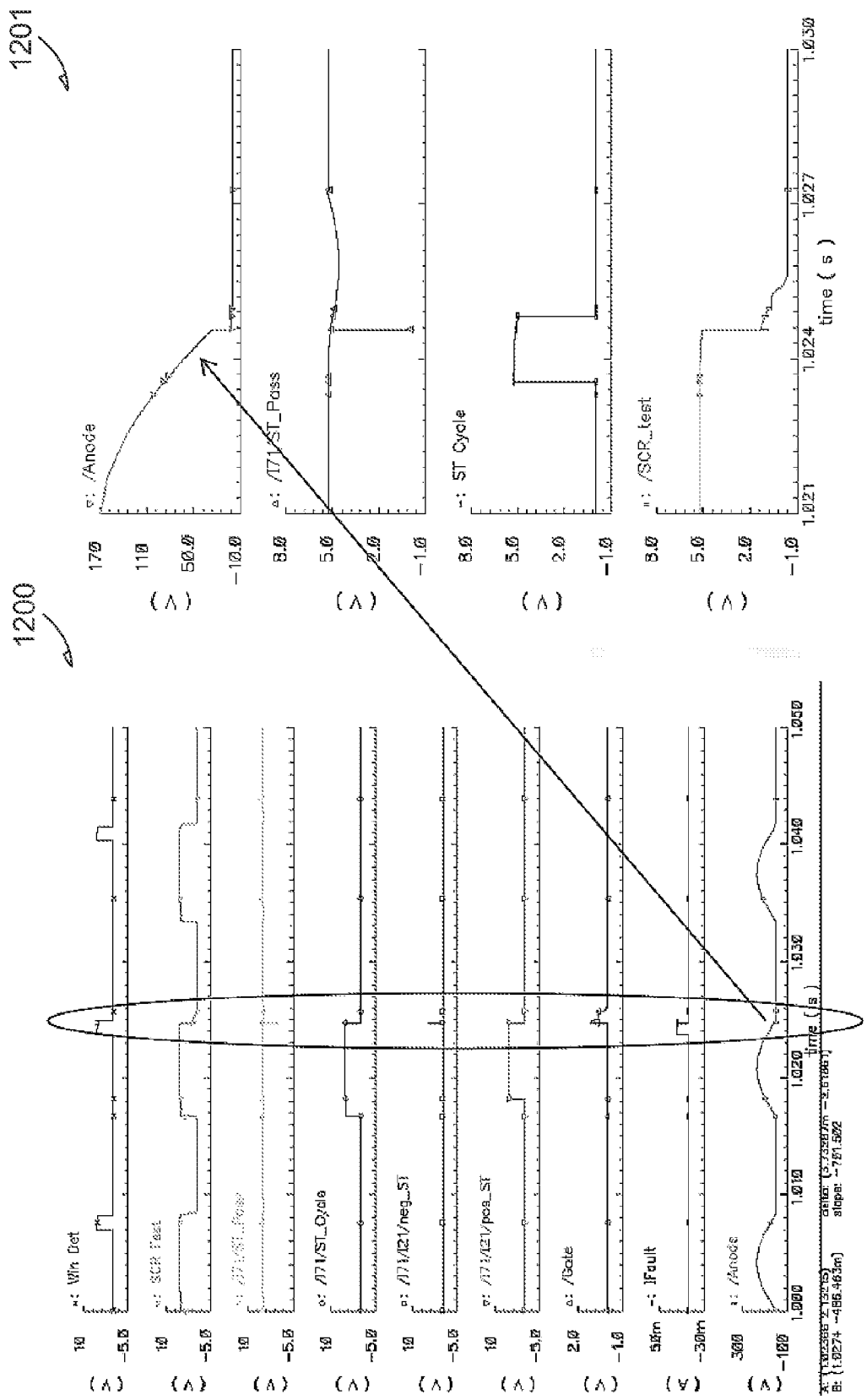

FIG. 12A illustrates generally an example of simulation results 1200 of a simulated ground fault. In an example, the simulated ground fault can test for normal functionality of a silicon-controlled rectifier (SCR), a ground fault circuit interrupter (GFCI) controller, a sense coil, or one or more other components, such as those illustrated in the example of FIG. 5. In an example, the SCR can trigger at the end of a positive half-cycle, for example, when an SCR anode voltage is about 30V and falling (e.g., not enough current to open load contacts).

FIG. 12B illustrates generally an example of simulation results 1201 including an exploded view of a portion of the simulation results 1200 illustrated in FIG. 12A

Figures 13A, 13B:
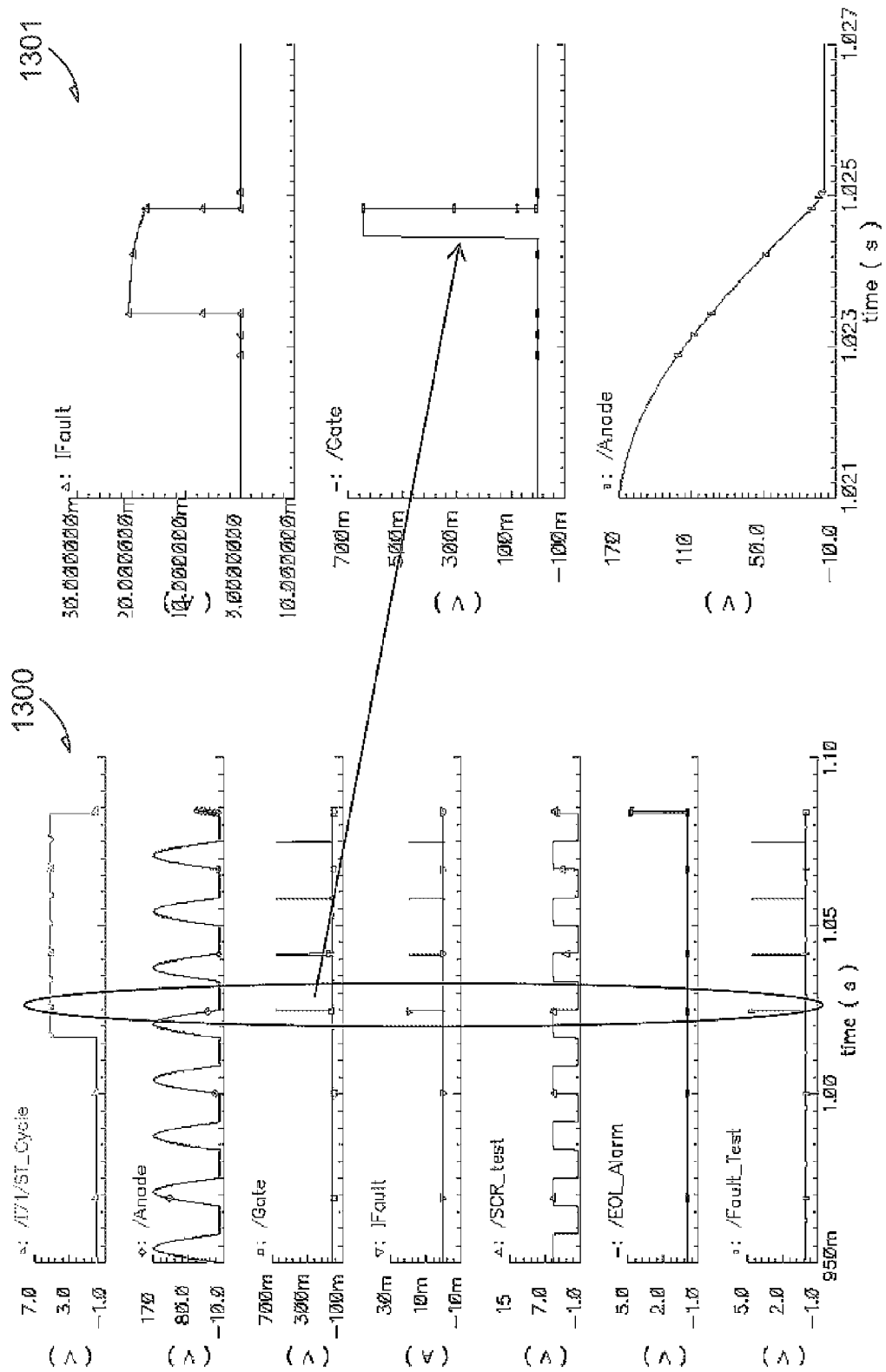

FIG. 13A illustrates generally an example of simulation results 1300 of a non-functional silicon-controlled rectifier (SCR), a ground fault circuit interrupter (GFCI) controller, or a sense coil. In an example, during an SCR test, the SCR can be triggered at the end of a positive half-cycle. If the SCR test does not pass within a threshold number of clock cycles (e.g., 4 clock cycles), an end-of-life (EOL) signal or alarm can be generated and, in certain examples, latched on. In an example, a non-functional SCR does not discharge SCR anode voltage at the end of the positive half-cycle.

FIG. 13B illustrates generally an example of simulation results 1301 including an exploded view of a portion of the simulation results 1300 illustrated in FIG. 13A

Additional Notes & Examples

In Example 1, a system can include a self-test (ST) ground fault circuit interrupter (GFCI) monitor configured to generate a simulated ground fault, starting in a first half-cycle of a first cycle of AC power and extending into a second half-cycle of the first cycle of AC power, and to detect a response to the simulated ground fault, wherein the first half-cycle of the first cycle of AC power precedes the second half-cycle of the first cycle of AC power.

In Example 2, the ST GFCI monitor of Example 1 can optionally be configured to generate the simulated ground fault to test functionality of a semiconductor switch without interrupting AC power to a load, the semiconductor switch configured to optionally control coupling or decoupling of the AC power and the load.

In Example 3, the semiconductor switch of any one or more of Examples 1-2 optionally includes a silicon-controlled rectifier (SCR) and the ST GFCI monitor of any one or more of Examples 1-2 is optionally configured to detect if the SCR is enabled in response to the simulated ground fault.

In Example 4, the ST GFCI monitor of any one or more of Examples 1-3 is optionally configured to generate an end-of-life (EOL) signal if the SCR is not enabled in response to the simulated ground fault.

In Example 5, any one or more of Examples 1-4 optionally include load contacts, a solenoid configured to open or close the load contacts, and the semiconductor switch, including a silicon-controlled rectifier (SCR) configured to control the solenoid, wherein closed load contacts are optionally configured to couple the AC power and the load and open load contacts are optionally configured to decouple the AC power and the load In Example 6, any one or more of Examples 1-5 optionally include a diode configured to prevent the solenoid from opening the load contacts during the second half-cycle of the first cycle of AC power, wherein the ST GFCI monitor is optionally coupled to the SCR and to the diode, wherein the diode is optionally coupled to the SCR, to the ST GFCI monitor, and to the solenoid, wherein the solenoid is optionally coupled to the diode and to the load contacts, and wherein the SCR is optionally configured to control current through the solenoid.

In Example 7, the ST GFCI monitor of any one or more of Examples 1-6 optionally includes a comparator configured to compare an anode voltage of a silicon-controlled rectifier (SCR) to a threshold voltage during the first half-cycle of AC power, the SCR configured to control a solenoid, wherein the ST GFCI monitor is optionally configured to detect an open circuit or high impedance condition during the first half-cycle of AC power using the comparison of the anode voltage of the SCR to the threshold voltage.

In Example 8, the threshold voltage of any one or more of Examples 1-7 optionally includes a voltage in a range of about 60 Volts RMS through about 105 Volts RMS.

In Example 9, the ST GFCI monitor of any one or more of Examples 1-8 is optionally configured to generate an end-of-life (EOL) signal if the anode voltage of the SCR is less than the threshold voltage.

In Example 10, the ST GFCI monitor of any one or more of Examples 1-9 is optionally configured to detect a manual self-test and to reset the ST GFCI monitor if a manual self-test is detected.

In Example 11, the first half-cycle of AC power of any one or more of Examples 1-10 optionally includes a positive half-cycle of AC power and the second half-cycle of AC power of any one or more of Examples 1-10 optionally includes a negative half-cycle of AC power.

In Example 12, the first half-cycle of AC power of any one or more of Examples 1-11 optionally includes a negative half-cycle of AC power and the second half-cycle of AC power of any one or more of Examples 1-11 optionally includes a positive half-cycle of AC power.

In Example 13, the ST GFCI monitor of any one or more of Examples 1-12 is optionally configured to generate the simulated ground fault to test functionality of a silicon-controlled rectifier (SCR) without interrupting AC power to a load, to bias the SCR during the second half-cycle of the first cycle of AC power, and to automatically detect if the SCR is enabled in response to the simulated ground fault to test functionality of the SCR.

In Example 14, one or more of Examples 1-10 optionally includes including a GFCI controller coupled to the ST GFCI monitor, the GFCI controller configured to detect a ground fault using a sense coil and to provide an enable signal to a semiconductor switch in response to the detected ground fault, the semiconductor switch optionally configured to interrupt AC power to a load in response to the detected ground fault.

In Example 15, the semiconductor switch of any one or more of Examples 1-14 optionally includes a silicon-controlled rectifier (SCR), and the GFCI controller of any one or more of Examples 1-14 is optionally configured to enable the SCR to interrupt AC power to the load in response to the detected ground fault.

In Example 16, the ST GFCI monitor of any one or more of Examples 1-15 is optionally configured to automatically generate the simulated ground fault at a periodic interval.

In Example 17, the ST GFCI monitor of any one or more of Examples 1-16 is optionally configured to automatically generate the simulated ground fault a first period of time following at least one of power-on or reset of the ST GFCI monitor and at a periodic interval following the first simulated fault.

In Example 18, any one or more of Examples 1-17 optionally include a first integrated circuit including the ST GFCI monitor and a second integrated circuit including a GFCI controller configured to detect a ground fault and to provide an enable signal to a semiconductor switch in response to the detected ground fault, the semiconductor switch configured to interrupt AC power to a load in response to the detected ground fault.

In Example 19, a method includes generating a simulated ground fault, using a self-test (ST) ground fault circuit interrupter (GFCI) monitor, starting in a first half-cycle of a first cycle of AC power and extending into a second half-cycle of the first cycle of AC power and detecting a response to the simulated ground fault, wherein the first half-cycle of the first cycle of AC power precedes the second half-cycle of the first cycle of AC power.

In Example 20, any one or more of Examples 1-19 optionally include selectively coupling or decoupling AC power to a load using a semiconductor switch and testing functionality of the semiconductor switch using the simulated ground fault without interrupting AC power to the load.

In Example 21, any one or more of Examples 1-20 optionally include detecting if the semiconductor switch is enabled in response to the simulated ground fault, wherein the semiconductor switch optionally includes a silicon-controlled rectifier (SCR).

In Example 22, any one or more of Examples 1-21 optionally include generating an end-of-life (EOL) signal if the SCR is not enabled in response to the simulated ground fault.

In Example 23, any one or more of Examples 1-22 optionally include comparing an anode voltage of a silicon-controlled rectifier (SCR) to a threshold voltage during the first half-cycle of AC power and detecting an open circuit or high impedance condition during the first half-cycle of AC power using the comparing the anode voltage to the threshold voltage.

In Example 24, any one or more of Examples 1-21 optionally include generating an end-of-life (EOL) signal if the anode voltage of the SCR is less than the threshold voltage.

In Example 25, any one or more of Examples 1-21 optionally include detecting a manual self-test and resetting the ST GFCI if a manual self-test is detected.

In Example 26, the first half-cycle of AC power of any one or more of Examples 1-25 optionally includes a positive half-cycle of AC power and the second half-cycle of AC power of any one or more of Examples 1-25 optionally includes a negative half-cycle of AC power.

In Example 27, the first half-cycle of AC power of any one or more of Examples 1-26 optionally includes a negative half-cycle of AC power and the second half-cycle of AC power of any one or more of Examples 1-26 optionally includes a positive half-cycle of AC power.

In Example 28, any one or more of Examples 1-27 optionally include testing functionality of a silicon-controlled rectifier (SCR) without interrupting AC power to a load, biasing the SCR during the second half-cycle of the first cycle of AC power, and detecting if the SCR is enabled in response to the simulated ground fault.

In Example 29, any one or more of Examples 1-28 optionally include detecting a ground fault using a sense coil and providing an enable signal to a semiconductor switch in response to the detected ground fault, the semiconductor switch configured to interrupt AC power to a load in response to the detected ground fault.

In Example 30, any one or more of Examples 1-29 optionally include enabling the semiconductor switch to interrupt AC power to the load in response to the detecting the ground fault.

In Example 31, the generating the simulated ground fault of any one or more of Examples 1-30 optionally includes automatically generating the simulated ground fault at a periodic interval.

In Example 32, the generating the simulated ground fault of any one or more of Examples 1-31 optionally includes automatically generating the simulated ground fault a first period of time following at least one of power-on or reset of the ST GFCI monitor and at a periodic interval following the first simulated fault.

In Example 33, a system includes load contacts, a solenoid configured to open or close the load contacts, wherein closed load contacts are configured to couple AC power and a load and open load contacts are configured to decouple the AC power and the load, a silicon-controlled rectifier (SCR) configured to control the solenoid, a self-test (ST) ground fault circuit interrupter (GFCI) monitor configured to automatically generate a simulated ground fault, starting in a first half-cycle of a first cycle of AC power and extending into a second half-cycle of the first cycle of AC power, to test functionality of the SCR at a first period of time following at least one of power-on or reset of the ST GFCI monitor and at a periodic interval following the first simulated fault a periodic interval without interrupting AC power to the load, and to generate an end-of-life (EOL) signal if the SCR is not enabled in response to the simulated ground fault, a diode configured to prevent the solenoid from opening the load contacts during the second half-cycle of the first cycle of AC power, and a GFCI controller configured to detect a ground fault using a sense coil and to provide an enable signal to the SCR in response to the detected ground fault. The ST GFCI monitor includes a comparator configured to compare an anode voltage of a silicon-controlled rectifier (SCR) to a threshold voltage to detect an open circuit or high impedance condition during the first half-cycle of AC power, wherein the ST GFCI monitor is configured to generate the EOL signal if the anode voltage of the SCR is less than the threshold voltage, wherein the threshold voltage includes a voltage in a range of about 60 Volts RMS through about 105 Volts RMS, wherein the first half-cycle of the first cycle of AC power precedes the second half-cycle of the first cycle of AC power, and wherein the ST GFCI monitor is configured to detect a manual self-test and to reset the ST GFCI monitor if a manual self-test is detected.

In Example 34, the first half-cycle of AC power of any one or more of Examples 1-33 optionally includes a positive half-cycle of AC power and the second half-cycle of AC power of any one or more of Examples 1-33 optionally includes a negative half-cycle of AC power.

In Example 35, a system or apparatus can include, or can optionally be combined with any portion or combination of any portions of any one or more of Examples 1-34 to include, means for performing any one or more of the functions of Examples 1-34, or a machine-readable medium including instructions that, when performed by a machine, cause the machine to perform any one or more of the functions of Examples 1-34.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system, comprising:
   a self-test (ST) ground fault circuit interrupter (GFCI) monitor configured to generate simulated ground fault, starting in a first half-cycle of a first cycle of AC power and extending into a second half-cycle of the first cycle of AC power, and to detect a response to the simulated ground fault,
   wherein the first half-cycle of the first cycle of AC power precedes the second half-cycle of the first cycle of AC power, and
   wherein the ST GFCI monitor is configured to trigger the simulated ground fault using a voltage on a solenoid coupled to the ST GFCI monitor.

2. The system of claim 1, wherein the ST GFCI monitor is configured to generate the simulated ground fault to test functionality of a semiconductor switch without interrupting AC power to a load, the semiconductor switch configured to control coupling or decoupling of the AC power and the load.

3. The system of claim 2, wherein the semiconductor switch includes a silicon-controlled rectifier (SCR), and
   wherein the ST GFCI monitor is configured to detect if the SCR is enabled in response to the simulated ground fault.

4. The system of claim 3, wherein the ST GFCI monitor is configured to generate an end-of-life (EOL) signal if the SCR is not enabled in response to the simulated ground fault.

5. The system of claim 2, including:
   load contacts;

a solenoid configured to open or close the load contacts, wherein closed load contacts are configured to couple the AC power and the load and open load contacts are configured to decouple the AC power and the load; and the semiconductor switch, including a silicon-controlled rectifier (SCR) configured to control the solenoid.

6. The system of claim 5, including:

a diode configured to prevent the solenoid from opening the load contacts during the second half-cycle of the first cycle of AC power, wherein the ST GFCI monitor is coupled to the SCR and to the diode, wherein the diode is coupled to the SCR, to the ST GFCI monitor, and to the solenoid, wherein the solenoid is coupled to the diode and to the load contacts, and wherein the SCR is configured to control current through the solenoid.

7. The system of claim 1, wherein the ST GFCI monitor includes a comparator configured to compare an anode voltage of a silicon-controlled rectifier (SCR) to a threshold voltage during the first half-cycle of AC power, the SCR configured to control a solenoid, and wherein the ST GFCI monitor is configured to detect an open circuit or high impedance condition during the first half-cycle of AC power using the comparison of the anode voltage of the SCR to the threshold voltage.

8. The system of claim 7, wherein the threshold voltage includes a voltage in a range of 60 Volts RMS through 105 Volts RMS.

9. The system of claim 7, wherein the ST GFCI monitor is configured to generate an end-of-life (EOL) signal if the anode voltage of the SCR is less than the threshold voltage.

10. The system of claim 9, wherein the ST GFCI monitor is configured to detect a manual self-test and to reset the ST GFCI monitor if a manual self-test is detected.

11. The system of claim 1, wherein the first half-cycle of AC power includes a positive half-cycle of AC power, and wherein the second half-cycle of AC power includes a negative half-cycle of AC power.

12. The system of claim 1, wherein the first half-cycle of AC power includes a negative half-cycle of AC power, and wherein the second half-cycle of AC power includes a positive half-cycle of AC power.

13. The system of claim 1, wherein the ST GFCI monitor is configured to generate the simulated ground fault to test functionality of a silicon-controlled rectifier (SCR) without interrupting AC power to a load, to bias the SCR during the second half-cycle of the first cycle of AC power, and to detect if the SCR is enabled in response to the simulated ground fault to test functionality of the SCR.

14. The system of claim 1, including:

a GFCI controller coupled to the ST GFCI monitor and configured to detect a ground fault using a sense coil and to provide an enable signal to a semiconductor switch in response to the detected ground fault, the semiconductor switch configured to interrupt AC power to a load in response to the detected ground fault.

15. The system of claim 14, wherein the semiconductor switch includes a silicon-controlled rectifier (SCR), and wherein the GFCI controller is configured to enable the SCR to interrupt AC power to the load in response to the detected ground fault.

16. The system of claim 1, wherein the ST GFCI monitor is configured to automatically generate the simulated ground fault at a periodic interval.

17. The system of claim 1, wherein the ST GFCI monitor is configured to automatically generate the simulated ground fault a first period of time following at least one of power-on or reset of the ST GFCI monitor and at a periodic interval following the first simulated fault.

18. The system of claim 1, including:

a first integrated circuit including the ST GFCI monitor; and a second integrated circuit including a GFCI controller configured to detect a ground fault and to provide an enable signal to a semiconductor switch in response to the detected ground fault, the semiconductor switch configured to interrupt AC power to a load in response to the detected ground fault.

19. The system of claim 1, wherein the ST GFCI circuit includes a comparator configured to receive a representation of the voltage on the solenoid, and wherein the ST GFCI circuit is configured to trigger the simulated ground fault using an output of the comparator.

20. A method, comprising:

generating a simulated ground fault, using a self-test (ST) ground fault circuit interrupter (GFCI) monitor, starting in a first half-cycle of a first cycle of AC power and extending into a second half-cycle of the first cycle of AC power; and detecting a response to the simulated ground fault, wherein the first half-cycle of the first cycle of AC power precedes the second half-cycle of the first cycle of AC power, and triggering, using the ST GFCI monitor, the simulated ground fault using a voltage on a solenoid coupled to the ST GFCI monitor.

21. The method of claim 20, including:

selectively coupling or decoupling AC power to a load using a semiconductor switch; and testing functionality of the semiconductor switch using the simulated ground fault without interrupting AC power to the load.

22. The method of claim 21, including:

detecting if the semiconductor switch is enabled in response to the simulated ground fault, wherein the semiconductor switch includes a silicon-controlled rectifier (SCR).

23. The method of claim 22, including:

generating an end-of-life (EOL) signal if the SCR is not enabled in response to the simulated ground fault.

24. The method of claim 20, including:

comparing an anode voltage of a silicon-controlled rectifier (SCR) to a threshold voltage during the first half-cycle of AC power; and detecting an open circuit or high impedance condition during the first half-cycle of AC power using the comparing the anode voltage to the threshold voltage.

25. The method of claim 24, including:

generating an end-of-life (EOL) signal if the anode voltage of the SCR is less than the threshold voltage.

26. The method of claim 25, including:

detecting a manual self-test; and resetting the ST GFCI if a manual self-test is detected.

27. The method of claim 20, wherein the first half-cycle of AC power includes a positive half-cycle of AC power, and wherein the second half-cycle of AC power includes a negative half-cycle of AC power.

28. The method of claim 20, wherein the first half-cycle of AC power includes a negative half-cycle of AC power, and wherein the second half-cycle of AC power includes a positive half-cycle of AC power.

29. The method of claim 20, including:
    testing functionality of a silicon-controlled rectifier (SCR) without interrupting AC power to a load, including:
      biasing the SCR during the second half-cycle of the first cycle of AC power; and
      detecting if the SCR is enabled in response to the simulated ground fault.

30. The method of claim 20, including:
    detecting a ground fault using a sense coil; and
    providing an enable signal to a semiconductor switch in response to the detected ground fault, the semiconductor switch configured to interrupt AC power to a load in response to the detected ground fault.

31. The method of claim 30, including:
    enabling the semiconductor switch to interrupt AC power to the load in response to the detecting the ground fault.

32. The method of claim 20, wherein the generating the simulated ground fault includes automatically generating the simulated ground fault at a periodic interval.

33. The method of claim 20, wherein the generating the simulated ground fault includes automatically generating the simulated ground fault a first period of time following at least one of power-on or reset of the ST GFCI monitor and at a periodic interval following the first simulated fault.

34. A system, comprising:
    load contacts;
    a solenoid configured to open or close the load contacts, wherein closed load contacts are configured to couple AC power and a load and open load contacts are configured to decouple the AC power and the load;
    a silicon-controlled rectifier (SCR) configured to control the solenoid;
    a self-test (ST) ground fault circuit interrupter (GFCI) monitor configured to automatically generate a simulated ground fault, starting in a first half-cycle of a first cycle of AC power and extending into a second half-cycle of the first cycle of AC power, to test functionality of the SCR at a first period of time following at least one of power-on or reset of the ST GFCI monitor and at a periodic interval following the first simulated fault a periodic interval without interrupting AC power to the load, and to generate an end-of-life (EOL) signal if the SCR is not enabled in response to the simulated ground fault;
    a diode configured to prevent the solenoid from opening the load contacts during the second half-cycle of the first cycle of AC power; and
    a GFCI controller configured to detect a ground fault using a sense coil and to provide an enable signal to the SCR in response to the detected ground fault,
    wherein the ST GFCI monitor includes a comparator configured to compare an anode voltage of a silicon-controlled rectifier (SCR) to a threshold voltage to detect an open circuit or high impedance condition during the first half-cycle of AC power,
    wherein the ST GFCI monitor is configured to generate the EOL signal if the anode voltage of the SCR is less than the threshold voltage,
    wherein the threshold voltage includes a voltage in a range of 60 Volts RMS through 105 Volts RMS,
    wherein the first half-cycle of the first cycle of AC power precedes the second half-cycle of the first cycle of AC power, and
    wherein the ST GFCI monitor is configured to detect a manual self-test and to reset the ST GFCI monitor if a manual self-test is detected.

35. The system of claim 34, wherein the first half-cycle of AC power includes a positive half-cycle of AC power, and wherein the second half-cycle of AC power includes a negative half-cycle of AC power.

* * * * *